(12) United States Patent
Matsuoka et al.

(10) Patent No.: US 6,589,815 B1
(45) Date of Patent: Jul. 8, 2003

(54) METHOD OF MANUFACTURING SEMICONDUCTOR DEVICE WITH PLATED HEAT SINK BY LASER CUTTING

(75) Inventors: Hiroshi Matsuoka, Tokyo (JP); Masahiro Tamaki, Tokyo (JP); Kazuo Hayashi, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 41 days.

(21) Appl. No.: 09/685,888

(22) Filed: Oct. 11, 2000

Related U.S. Application Data

(62) Division of application No. 09/288,016, filed on Apr. 8, 1999, now Pat. No. 6,157,077.

(30) Foreign Application Priority Data

Sep. 29, 1998 (JP) ............................................. 10-275390

(51) Int. Cl.[7] .......................... H01L 21/44; H01L 21/48; H01L 21/50; H01L 21/301; H01L 21/46
(52) U.S. Cl. ...................... 438/113; 438/462; 438/463; 438/464; 438/465; 438/114
(58) Field of Search .................... 438/462, 463, 438/464, 465, 113, 114; 257/620, 623, 713

(56) References Cited

U.S. PATENT DOCUMENTS

| | | | | |
|---|---|---|---|---|
| 3,792,730 | A | | 2/1974 | Andersson ................. 165/167 |
| 4,729,971 | A | * | 3/1988 | Coleman .................... 437/226 |
| 5,338,967 | A | * | 8/1994 | Kosai ........................ 257/620 |
| 5,343,075 | A | | 8/1994 | Nishino ..................... 257/686 |
| 5,381,042 | A | | 1/1995 | Lerner et al. ............... 257/712 |
| 5,872,396 | A | | 2/1999 | Kosaki ...................... 257/712 |
| 5,872,397 | A | | 2/1999 | Diffenderfer et al. ....... 257/723 |
| 5,998,238 | A | * | 12/1999 | Kosai ........................ 438/114 |

FOREIGN PATENT DOCUMENTS

JP          6-53265          2/1994

* cited by examiner

*Primary Examiner*—Wael Fahmy
*Assistant Examiner*—Shrinivas H. Rao
(74) *Attorney, Agent, or Firm*—Leydig, Voit & Mayer, Ltd.

(57) ABSTRACT

A method for manufacturing a semiconductor device having a heat dissipating layer including forming first separation grooves in a front surface of the semiconductor substrate; forming second separation grooves at bottoms of the first separation grooves; forming a linkage metal layer in the second semiconductor grooves; and cutting the linkage metal layer using laser light. According to this method, the top of the linkage metal layer is spaced from the surface of the semiconductor substrate and thus short-circuiting between the linkage metal layer and wires is avoided.

4 Claims, 8 Drawing Sheets

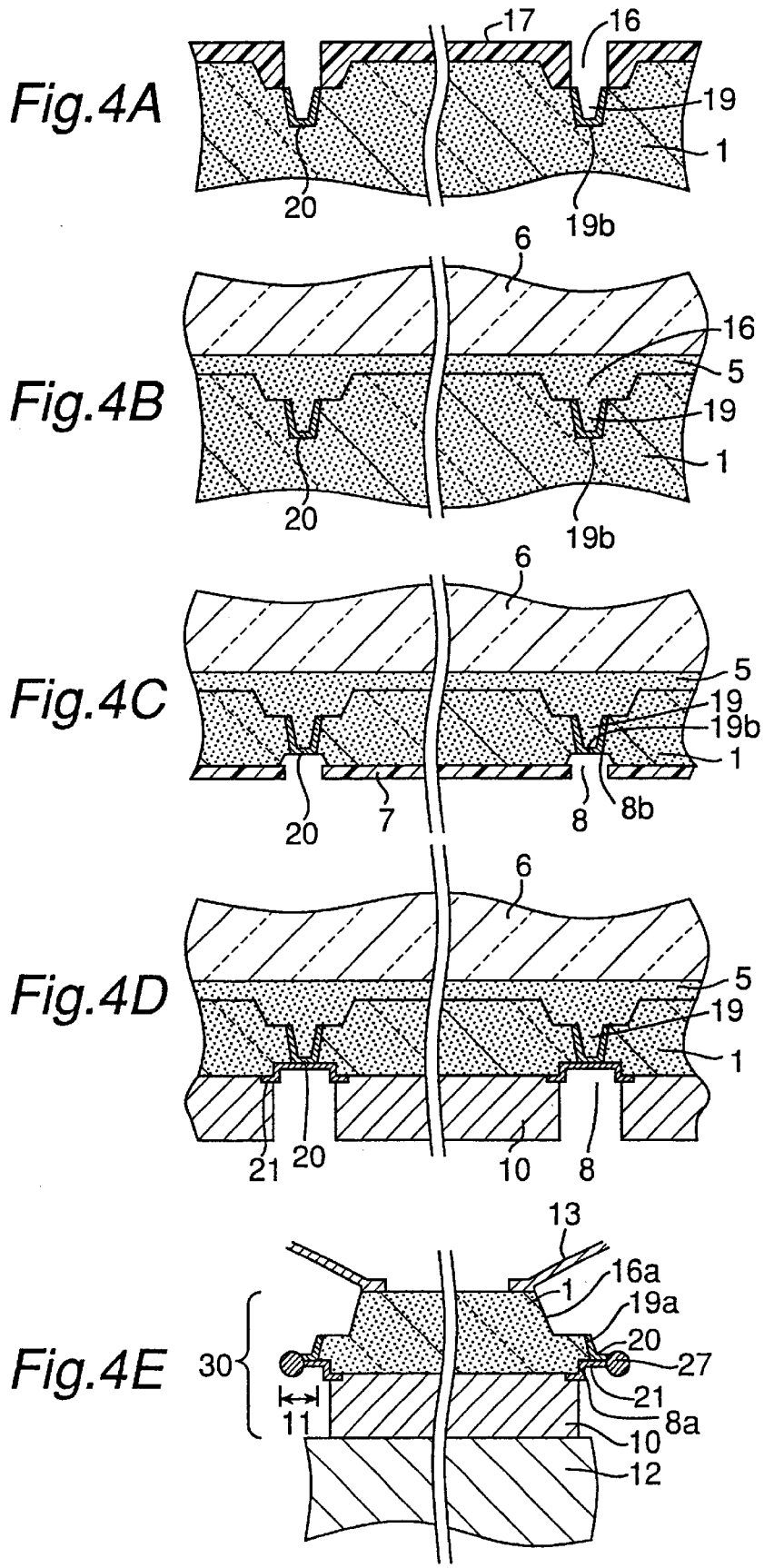

METHOD OF MANUFACTURING SEMICONDUCTOR DEVICE WITH PLATED HEAT SINK BY LASER CUTTING

This disclosure is a division of Application No. 09/288, 016, filed on Apr. 8, 1999, now U.S. Pat. No. 6,157,077.

BACKGROUND OF THE INVENTION

The present invention relates to a semiconductor device having a heat dissipating metal layer on the back side thereof and, more particularly to a method of manufacturing the semiconductor device wherein a semiconductor wafer is divided into chips by laser cutting.

A semiconductor device that must have lower thermal resistance such as high-output FET used in microwave communication or the like generally requires reduced thickness of the semiconductor substrate, for example, 50 $\mu$m or less. It is also necessary to form a thick heat dissipating metal layer on the back-side of the substrate in order to improve the heat dissipation efficiency, and to prevent the substrate from breaking during handling.

In Using a dicing method to divide such a semiconductor wafer having the dissipating metal layer into semiconductor chips, which is employed for ordinary semiconductor wafers, clogging of the dicing saw may occur due to the heat dissipating metal sticking thereto. In using a wet etching method instead of the dicing method to divide the wafer, separated semiconductor chips tend to be scattered in a solvent bath at the end of the separation process. The chip scattering makes it time-consuming to collect the separated chips and makes a problem of chip breakage during collection.

Kosaki et al. PCT Application No. PCT/JP96/02758 discloses a method of cutting off a semiconductor wafer into semiconductor chips by means of etching and laser cutting. This method will be described below with reference to the accompanying drawings.

FIG. 5A to FIG. 5G are cross sectional views showing a flow sheet for manufacturing a semiconductor device having a heat dissipating metal layer. First, front separation grooves 3 are formed by etching using a resist pattern 2 as a mask on the surface of a GaAs substrate 1 whereon semiconductor elements have been formed (FIG. 5A). Then a first linkage metal layer 4 is formed in the front separation grooves 3 by plating or other methods (FIG. 5B).

Then wax 5 is applied to the front surface of the GaAs substrate 1, which is then bonded onto a support substrate 6 such as a glass plate or a sapphire plate. Then the back side of the GaAs substrate 1 is polished until the thickness of the GaAs substrate 1 is reduced to about 20 to 30 $\mu$m (FIG. 5C). The depth of the front separation groove 3 is typically one-half or less of the thickness of the polished substrate.

A resist pattern 7, which has apertures at positions facing bottom surfaces 3b of the front separation grooves 3, is formed on the back side of the GaAs substrate 1. Using the resist pattern 7 as a mask, back side of the GaAs substrate 1 is etched until the bottom surfaces of the linkage metal layer 4 in the front separation grooves is exposed, thereby to form back separation grooves 8 (FIG. 5D). Width of the bottom surfaces 3b of the front separation grooves 3 must be greater than the width of the bottom surfaces 8b of the back separation grooves 8. In case the bottom surfaces 8b are wider than the bottom surfaces 3b, variations in the amount of etching may lead to over etching where the edge of the bottom surface 8c is excessively etched along the first linkage metal layer 4 (FIG. 6).

After removing the resist pattern 7, a plated feeder layer (not shown) is formed over the entire back surface of the GaAs substrate 1. Then a second linkage metal layer 9 is formed by plating in the back separation grooves 8 for reinforcement of the first linkage metal layer 4. This is followed by the formation of a heat dissipating metal layer 10 by electroplating on portions other than that opposing the bottoms of the front separation grooves 3 (FIG. 5E).

Then the GaAs substrate 1 is pulled off the support substrate 6 and an expand film (not shown) is attached to the heat dissipating metal layer 10. The first and the second linkage metal layers 4, 9 are cut by means of a YAG laser or the like from the side of the first linkage metal layer, thereby separating the GaAs substrate 1 into semiconductor chips 30 (FIG. 5F). The linkage metal layers which have been cut off by the laser have a flange-shaped protrusion 11 with a rounded edge 27.

The semiconductor chip thus produced is bonded onto a package 12 by soldering or the like. Then wires 13 are bonded onto bonding pads located on the surface of the GaAs substrate 1. Last, the entire semiconductor chip is sealed with a resin.

According to the method of cutting the semiconductor chips by laser light, there occurs no problem like clogging of the dicing saw as experienced in the dicing method. Further the semiconductor chips which have been cut by the laser light are arranged orderly on the expand film. Thus there is no need to collect the chips, which is required in the case of using the wet etching method.

With the laser cutting method described above, however, top edges of the first linkage metal layer 4 are located in the same plane as the surface of the GaAs substrate 1. Moreover, the edges of the first linkage metal layer 4 may protrude beyond the surface of the GaAs substrate 1, because the metal formation process based on plating technique or the like. This may cause such a problem that the wires 13 and the linkage metal layer 4 are short-circuited during the wire-bonding processes. Thus it is difficult to stabilize the production yield of the semiconductor device. Moreover, when the device is heated, the wire 13 may be deformed and touch the first linkage metal layer due to thermal deformation of the resin around the wire, this results in poor reliability of the semiconductor device.

The first linkage metal layer 4 and the second linkage metal layer 9 have flange-shaped protrusions 11 after being cut by the laser light. Since the flange-shaped protrusions 11 protrude over a significant length compared to the thickness thereof and the length of the protrusions varies significantly, the protrusions 11 tend to bend during handling the semiconductor chips. The bent protrusions 11 may contact the wires and cause failures of the device.

SUMMARY OF THE INVENTION

The present invention has been developed to overcome the above-described disadvantages.

It is accordingly an object of the present invention to provide a method of manufacturing semiconductor devices based on a laser cutting system, which is capable of preventing short-circuiting between the wires and the top edges of the linkage metal layer, and preventing the deformation of the linkage metal layers during chip handling.

This and other objects are achieved in accordance with the present invention with a method of manufacturing a semiconductor device comprising the steps of:

(A) forming front separation grooves between the semiconductor devices on a front surface of a semiconductor substrate by etching;

(B) depositing a linkage metal layer in each front separation grooves;

(C) thinning the semiconductor substrate from a back surface of the semiconductor substrate;

(D) forming a heat dissipating metal layer on the back surface of the semiconductor substrate except opposite the front separation grooves;

(E) forming back separation grooves facing bottom surfaces of the front separation grooves on a back surface of the semiconductor substrate by etching to expose the linkage metal layer; and (F) cutting off the linkage metal layer by a laser beam to separate the semiconductor devices;

wherein at least one of the steps (A) and (E) comprises two or more separate etching steps, wherein bottom surfaces of grooves formed in the first etching step is further etched in the following etching steps.

The front separation groove forming step (A) preferably comprises following steps, (a) forming a first resist pattern having a first apertures on the semiconductor substrate;

(b) forming first front separation grooves by etching using the first resist pattern as a mask;

(c) forming a second resist pattern covering side surfaces of the first front separation grooves and a front surface of the semiconductor substrate and having apertures at bottoms of the first front separation grooves; and (d) forming second front separation grooves continuing below the first front separation grooves by etching using the second resist pattern as a mask. In that case, the linkage metal layer deposited in the step (B) is preferably deposited only in the second front separation grooves using the second resist pattern as a mask. Thus, the top edges of the linkage metal layer is located below the surface of the semiconductor substrate, and short circuiting between the linkage metal and the wires connected to the semiconductor substrate is prevented.

The back separation groove forming step (E) also preferably comprises following steps:

(a) forming first back separation grooves on a back surface of the semiconductor substrate by etching to such a depth that the linkage metal layer is not exposed using the heat dissipating metal layer as an etching mask;

(b) forming a protective film covering the side surfaces of the first back separation grooves; and (c) forming second back separation grooves by etching to such a depth that the linkage metal layer is exposed using the protective film and the heat dissipating metal layer as etching masks. Thus the back separation grooves consisting of the first and the second back separation grooves are formed.

These steps can reduce the variation of the amount of side etching of the back separation grooves. Therefore, the variation in the length of the protrusion of the linkage metal layer after the laser cutting is reduced.

Also it is preferable to set the depth of the front separation grooves to be deeper, not less than a half of the thickness of the thinned semiconductor substrate. This makes it possible to set the bottom sufraces of the front separation grooves to be narrower than the bottom surfaces of the back separation grooves. This increases the effective area of the semiconductor wafer where semiconductor elements can be formed. Also metal drops sputtered from the linkage metal layer during laser cutting is prevented from depositing on the front surface of the semiconductor substrate, since the portion of the linkage metal layer being cut by the laser is kept far below the surface of the semiconductor substrate.

Another embodiment of the present invention is a semiconductor device comprising:

(A) a semiconductor substrate having a front and a back surface and having semiconductor elements formed at the front surface thereof;

(B) a heat dissipating metal layer formed on a back surface of the semiconductor substrate; and (C) a metal layer having a flange-shaped protrusion, which has formed on a side surface of the semiconductor substrate to link the semiconductor devices with each other and has cut off by a laser beam;

wherein the semiconductor substrate has four side surfaces, each of which is shaped so as to have an outwardly tapered protrusion defined by a pair of upper and lower side faces that extend to converge at a point laterally outwardly of the substrate; one of said upper and lower side faces has stepped configuration.

Preferably the upper side face of the semiconductor substrate has a shoulder portion, which makes stepped configuration of the upper side face, and the metal layer is formed on the upper side face except the shoulder. The top edges of the linkage metal layer is thus located below the surface of the semiconductor substrate, and short circuiting between the linkage metal and the wires connected to the semiconductor substrate is prevented.

Also it is preferable that the upper side face of the semiconductor substrate has a protrusion laterally outwardly protruding therefrom, which makes stepped configuration of the upper side face, and the metal layer is formed on the upper side face except the protrusion thereof. This configuration gives such an advantage that a junction interface between the metal and the semiconductor substrate is hidden from above the chip.

Preferably the lower side face of the side surface of the semiconductor substrate has stepped configuration formed by a first face and a second face; wherein the first face is formed by a first etching and the second face is formed by a second etching.

This makes it possible to reduce the variation in the amount of side etching during etching of the back separation grooves. Thus, the variation in the length of the flange-shaped protrusion of the metal after laser cutting can be reduced.

It is further preferable that the upper side face of the semiconductor substrate is longer and protrudes beyond the lower side face of the semiconductor substrate. This configuration makes it possible to set the portion of the metal being cut off by laser to be further away from the surface of the semiconductor substrate. Consequently, sputter from the metal during laser cutting can be prevented from depositing on the semiconductor substrate surface. Also the effective area of the semiconductor substrate where the semiconductor elements can be formed are increased.

BRIEF DESCRIPTION OF THE DRAWINGS

The above and other objectives and features of the present invention will become more apparent from description of preferred embodiments thereof with reference to the accompanying drawings, throughout which like parts are designated by like reference numerals, and wherein:

FIGS. 4A to 4E are cross sectional views showing a flow for manufacturing a semiconductor device according to a fourth embodiment of the present invention.

DETAILED DESCRIPTION OF THE PREFERRED EMBODIMENTS

The application is based on U.S. application No. 09/134331, Japanese application No. H10-275390, the contents of which are incorporated hereinto by reference.

Embodiment 1

It is an object of the first embodiment of the present invention to prevent wires from being short-circuited with the upper edges of the linkage metal layer, by forming the front separation grooves in two separate steps of etching. The method of manufacturing the semiconductor device according to the first embodiment of the present invention will be described below with reference to FIG. 1A to FIG. 1E.

Figure 1A:
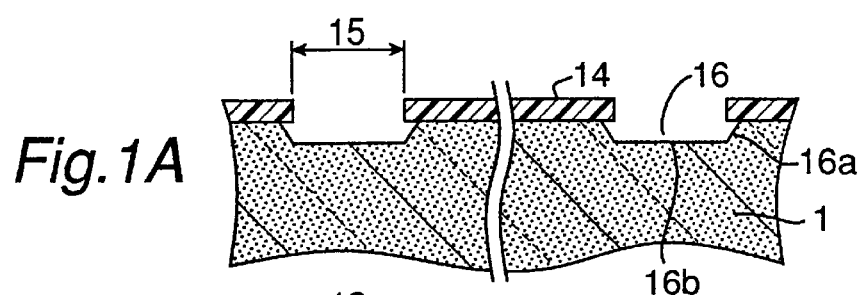
FIGS. 1A to 1E are cross sectional views showing a flow for manufacturing a semiconductor device according to a first embodiment of the present invention.
Figure 1B:
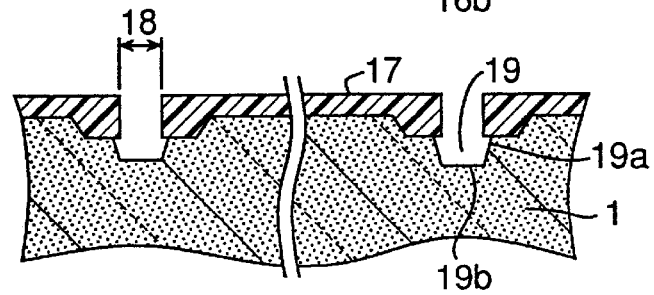

First, semiconductor elements are formed on a front surface of GaAs substrate 1, which is a typical semiconductor substrate for high out-put FET. Then the surface of the GaAs substrate 1 is etched using a first resist pattern 14 as an etching mask (a first etching step), forming first front separation grooves 16 between semiconductor devices (FIG. 1A). In this embodiment, apertures 15 of the first resist pattern 14 are wider than the required width of the bottoms 19b of the front separation grooves (see FIG. 1B).

After the first resist pattern 14 has been removed, a second resist pattern 17, which has apertures at the bottom surfaces 16b of the first front separation grooves, is formed to cover the front surface of the GaAs substrate 1 and the side surfaces 16a of the first front separation grooves 16. The second resist pattern 17 is used as a mask in. etching of the bottom surfaces 16b of the front separation grooves 16 (a second etching step), thereby to form second front separation grooves 19 continuing from the bottoms of the first front separation grooves (FIG. 1B) The aperture 18 of the second resist pattern 17 may have any width, provided that the side surface 16a of the front separation groove can be covered. However, in this embodiment, the width of the aperture 18 of the second resist pattern 17 is made narrower than the aperture 15 of the first resist pattern 14. The front separation grooves formed in this process have such configuration that the first front separation grooves 16 having greater width and the second front separation grooves 19 having smaller width are arranged vertically.

Figure 1C:
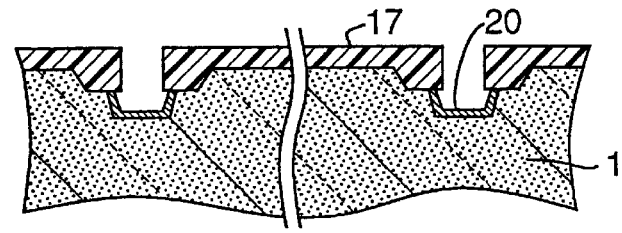
Figure 1D:
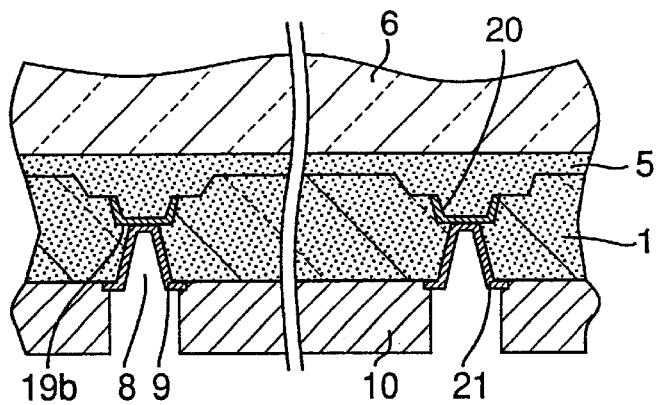
Figure 1E:
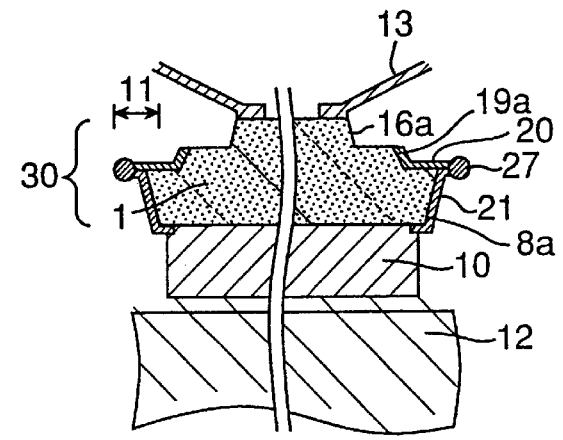

The second resist pattern 17 is then used as a mask for depositing a first linkage metal layer 20 (FIG. 1C). The linkage metal layer 20 may be formed by electroless plating. The linkage metal layer 20, formed by electroless plating, does not deposit on the resist pattern 17 and therefore only the surfaces of the second front separation grooves 19 are covered with the linkage metal layer 20. In case of a step between the side surfaces 19a of the second front separation grooves 19 and the side surfaces of the resist pattern 17, the linkage metal layer 20 may also be formed by vapor deposition or sputtering. In this case, although the linkage metal layer 20 deposits over the entire surface, the metal layer deposited on portions other than the inner surfaces of the second front separation grooves is removed at the same time when the resist pattern 17 is removed. As a result, the first linkage metal layer 20 can be formed only on the surfaces of the second front separation grooves 19.

In this embodiment, the front separation grooves are formed in two steps of etching, although the front separation grooves may also be formed in three steps of etching. In case such a process is employed, the relation between the first step and the second step in this embodiment is applied to between the first step and the second step as well as to between the second step and the third step. And the linkage metal layer 20 is formed after the third step of etching.

This also applies similarly to a case where the front separation grooves are etched in four or more steps.

Then, the GaAs substrate 1 is bonded to a supporting substrate 6 using wax 5. After polishing the back surface of the substrate, the back separation grooves 8 are formed at positions opposite to the front separation grooves 19, thereby to expose the first linkage metal layer 20. Then, a second linkage metal layer 21 is formed to cover the surface of the back separation grooves 8 for reinforcement. Then a heat dissipating metal layer 10 is formed on portions except for the region facing the bottom surfaces 19b of the front separation grooves (FIG. 2D). It is necessary to make sure that the region where the heat dissipating metal layer 10 is formed does not obstruct the laser cutting operation. However, it is not necessary to completely exclude the region which oppose the bottoms 19b of the front separation grooves. In case the first linkage metal layer 20 is thick and strong enough, the second metal layer 21 for reinforcement may be omitted.

Then in a step similar to that of the prior art, the GaAs substrate 1 is remove from the support substrate 6 and bonded onto an expand film, whereon the first linkage metal layer 20 and the second linkage metal layer 21 are cut by laser light, thereby to produce a semiconductor chips 30. The semiconductor chip 30 is soldered onto a package 12. Wires 13 are connected to the surface of the GaAs substrate 1, thereby completing the semiconductor device (FIG. 1E) The linkage metal layers 20 and 21 have round edge 27 due to melting. The linkage metal layers 20 and 21 have also flange-shaped protrusion 11.

The semiconductor substrate of the semiconductor device has four side surfaces. Each of the side faces is formed through the above-described process. Thus, each of the side faces is shaped so as to have an outwardly tapered protrusion defined by a pair of upper side face (16a and 19a) and lower side faces 8a that extend to converge at a point laterally outwardly of the substrate. The upper side face of the semiconductor substrate has a stepped configuration. That is, the upper side face has a shoulder portion 16a. The metal layer 20 is formed on the upper side face 19a except the shoulder portion 16a.

Thus upper edges of the first linkage metal layer 20 are located below the surface of the GaAs substrate 1. Consequently, even when the wire 13 is deformed somewhat, the wire 13 will not touch the first linkage metal layer 20. Therefore, short-circuiting during the wire bonding process is prevented, and thereby this stabilizes the production yield of the semiconductor devices. Also it is possible to prevent short-circuiting due to deformation of the wires 13 caused by thermal stress, thereby improving the reliability of the semiconductor device.

Embodiment 2

The second embodiment of the present invention is also intended to prevent short-circuiting between the upper edges of the linkage metal layer and the wires. The front separation grooves are formed in two separate steps of etching. The second embodiment will be described below with reference to FIG. 2A to FIG. 2E.

Figure 2A:
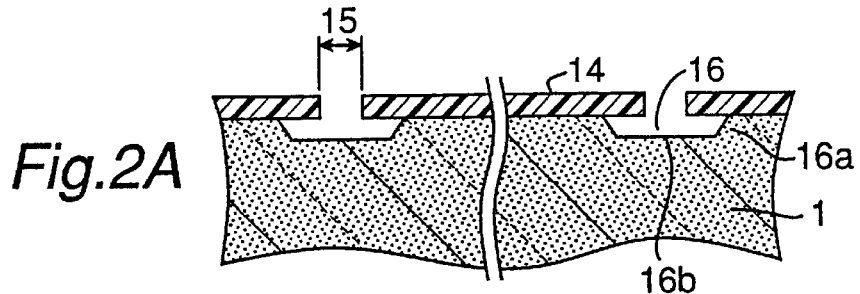
FIGS. 2A to 2E are cross sectional views showing a flow for manufacturing a semiconductor device according to a second embodiment of the present invention.

The surface of a GaAs substrate 1 is etched using a first resist pattern 14 as a mask (a first etching step), thereby to form first front separation grooves 16 (FIG. 2A). In this embodiment, the first resist pattern 14 is formed to have an aperture 15 of width equal to or smaller than the required width of the bottoms (19b in the drawing) of the front separation grooves.

Figure 2B:
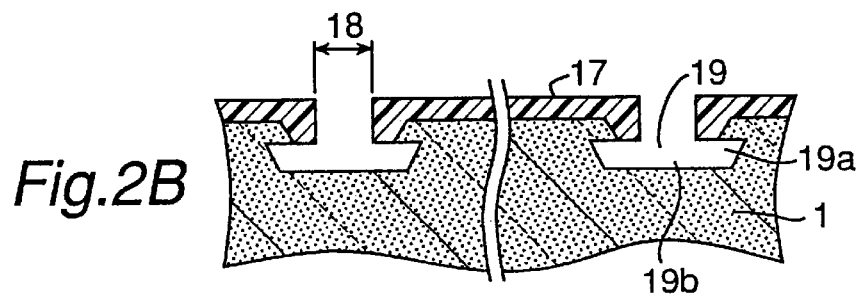

Then, similar to the first embodiment, after the first resist pattern 14 has been removed, a second resist pattern 17, which has apertures at the bottoms 16b of the first front separation grooves 16, is formed to cover the front surface of the GaAs substrate 1 and the side surfaces 16a of the first front separation grooves 16. The second resist pattern 17 is used as a mask in etching of the bottoms 16b (a second etching step), thereby to form a second front separation grooves 19 (FIG. 2B). An aperture 18 of the second resist pattern is made equal to or a little wider than the aperture 15 of the first resist pattern. However, the aperture 18 must not be wider than the bottoms 16b of the first front separation grooves. The front separation grooves formed in this process has such configuration that the first front separation grooves 16 and the second front separation grooves 19 having widths the same as the former or greater are arranged vertically.

Figure 2C:
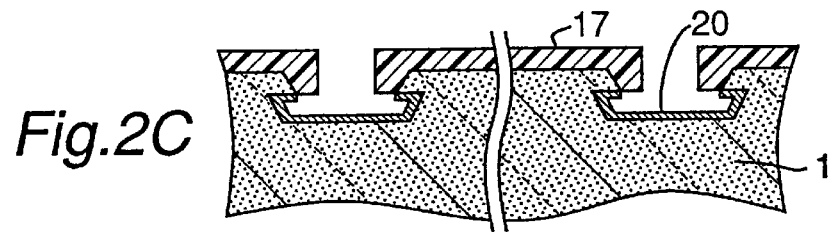
Figure 2D:
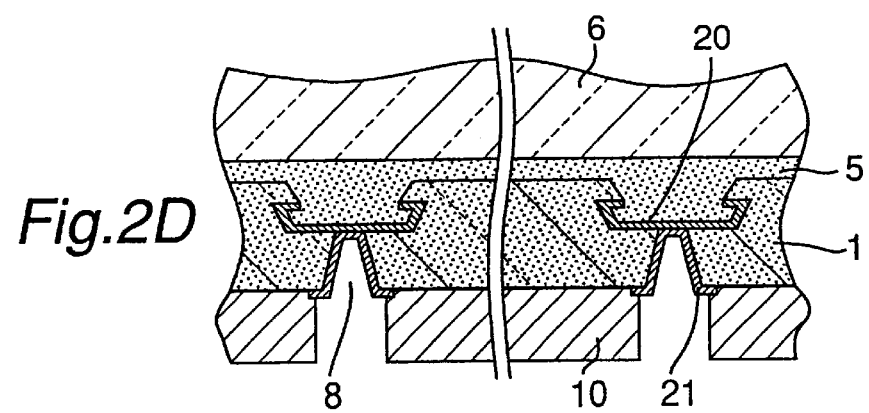

The second resist pattern 17 is then used as a mask for forming a first linkage metal layer 20 (FIG. 2C). The linkage metal layer 20 may be formed in an electroless plating process. The linkage metal layer does not deposit on the resist pattern 17 and therefore only the surfaces of the second front separation grooves ate plated with the first linkage metal layer 20. In this embodiment, too, the front separation grooves may be formed in three steps of etching. In case such a process is employed, the relation between the first step and the second step in this embodiment is applied between the first step and the second step and between the second step and the third step. And the linkage metal layer 20 is formed after the third step of etching.

Figure 2E:
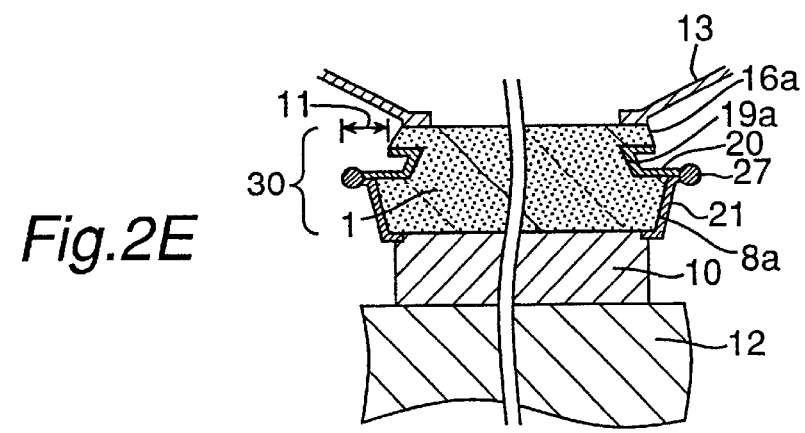

Then, similar to the first embodiment, the GaAs substrate 1 is bonded onto a support substrate 6 and is polished on the back surface thereof, then back separation grooves 8 are formed. After forming a second linkage metal layer 21 for reinforcement and a heat dissipating metal layer 10 (FIG. 2D), the GaAs substrate 1 is removed from the support substrate 6. Then, the first linkage metal layer 20 and the second linkage metal layer 21 are cut off by the laser, thereby to obtain the semiconductor chips 30 (FIG. 2E). The semiconductor chip 30 is soldered onto a package 12 and wires 13 are connected, thereby completing a semiconductor device.

The semiconductor device in this embodiment, similarly to the embodiment 1, has four side surfaces each of which is shaped so as to have an outwardly tapered protrusion defined by a pair of upper side face (16a and 19a), which has a stepped configuration, and lower side faces 8a that extend to converge at a point laterally outwardly of the substrate. However, the stepped configuration of the upper side face is different from that in the embodiment 1. The upper side face of the semiconductor substrate has a protrusion laterally outwardly protruding therefrom. The metal layer is formed on the upper side face except the protrusion thereof.

Since the upper edges of the first linkage metal layer 20 are located below the surface of the GaAs substrate 1 away therefrom, similar to the first embodiment, the wires 13 and the upper edges of the first linkage metal layer 20 can be prevented from short-circuiting.

Moreover, the semiconductor device of this embodiment has such advantages as described below, because of the configuration where the junction interface between the first linkage metal layer 20 and the GaAs substrate 1 is hidden from above the semiconductor chip.

Observation of the junction interface reveals gaps and traces of reaction since the first linkage metal layer 20 is generally formed by the electroless plating process.

A laser-cut face 27, which is close to the junction interface, requires visual inspection from above the chip to see whether there is any abnormality in the appearance. In case the junction interface can be seen from above the chip, the gaps and the traces of reaction present in the junction interface may cause confusion with an abnormality in the appearance of the laser-cut face, leading to trouble in the appearance inspection step for the laser-cut surface 27. In this embodiment, since the junction interface cannot be seen from the above, there occurs no trouble in the appearance inspection step.

Embodiment 3

It is an object of the third embodiment of the present invention to reduce variations of the amount of side etching when forming the back separation grooves. This reduces the variation in the length of the flange-shaped protrusions of the linkage metal layer, and thus prevents deformation of the protrusions during handling the chip.

Figure 5A:
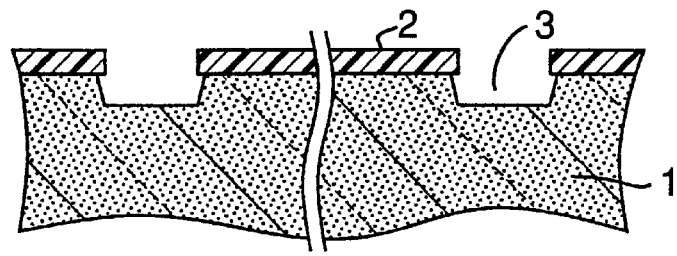
FIGS. 5A to 5G are cross sectional views showing a flow for manufacturing a semiconductor device of the prior art.
Figure 5B:
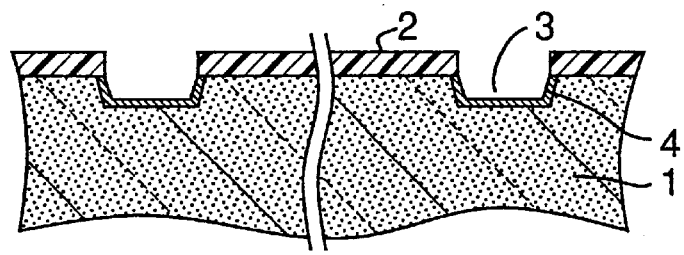
Figure 5C:
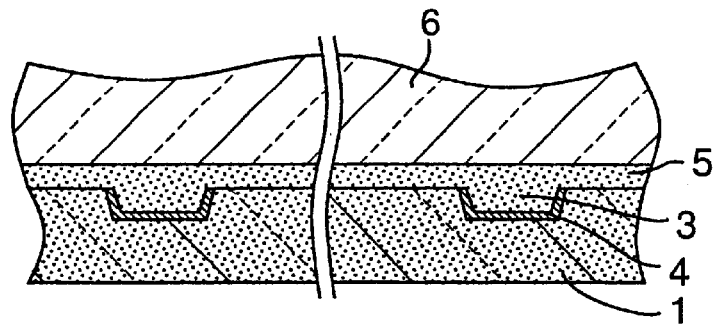
Figure 5D:
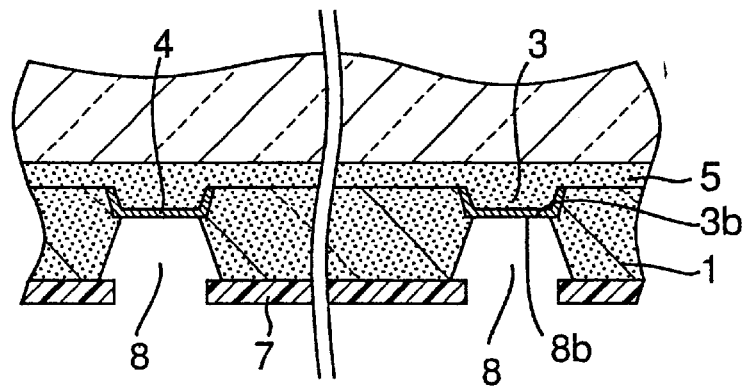
Figure 5E:
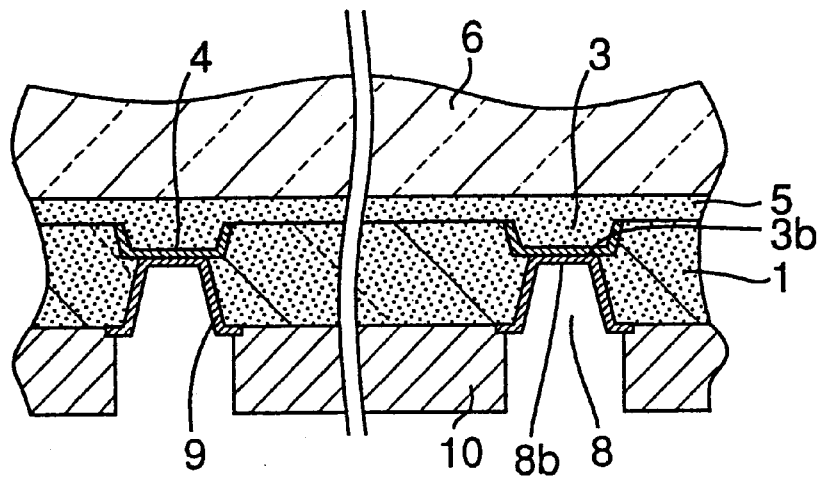
Figure 5F:
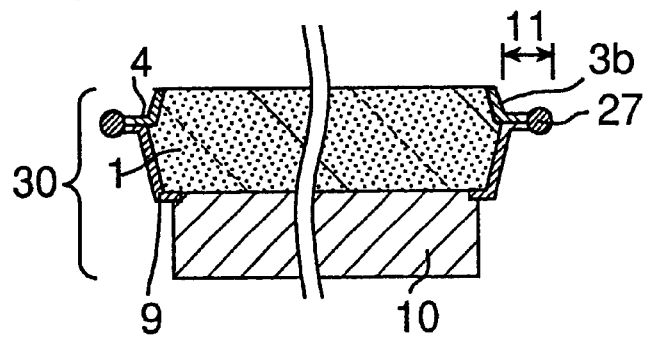
Figure 5G:
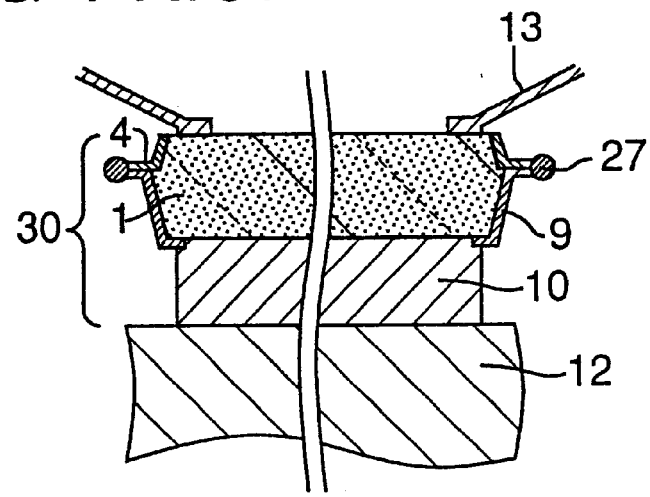
Figure 6:
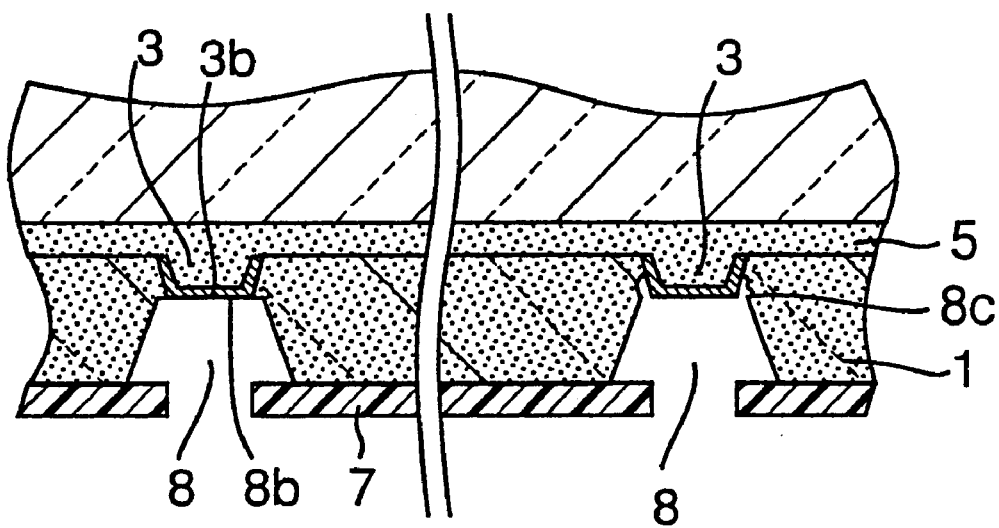
FIG. 6 is a cross sectional view showing a part of a flow for manufacturing the semiconductor device of the prior art.

Length of the flange-shaped protrusions 11 is determined by the width of the shorter one of the bottoms 3b of the front separation grooves 3 and the bottoms 8b of the back separation grooves 8 (see FIG. 5E, FIG. 5F). As described previously, the bottoms 3b of the front separation grooves 3 are generally wider than the bottoms 8b of the back separation grooves 8. Thus the length of the flange-shaped protrusions 11 are determined by the width of the bottoms 8b of the back separation grooves 8. The variation in the width of the bottoms 8b is mainly determined by the variation in the amount of side etching during etching the back separation grooves. This means that the variation in the length of the flange-shaped protrusions 11 can be reduced by suppressing the variation in the amount of side etching of during etching the back separation grooves.

In this embodiment, the back separation grooves are formed in two separate steps of etching in order to suppress the variation in the amount of the side etching.

The production steps according to the third embodiment will be described below with reference to FIG. 3A to FIG. 3G.

Figure 3A:
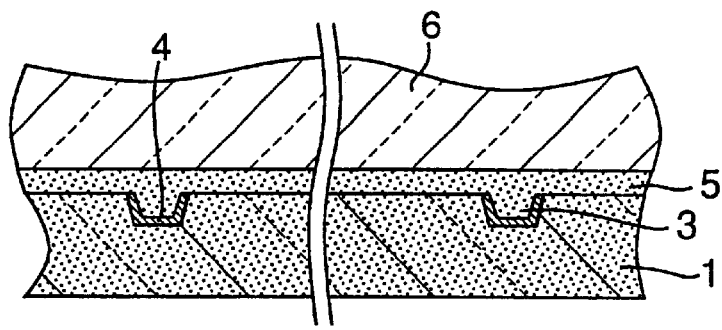
FIGS. 3A to 3G are cross sectional views showing a flow for manufacturing a semiconductor device according to a third embodiment of the present invention.

First, front separation grooves 3 are formed on a GaAs substrate 1, and are then covered by a first linkage metal layer 4. Then the GaAs substrate 1 is bonded on the front surface thereof to a support substrate 6 with wax 5 and is polished on the back surface to reduce its thickness (FIG. 3A).

Figure 3B:
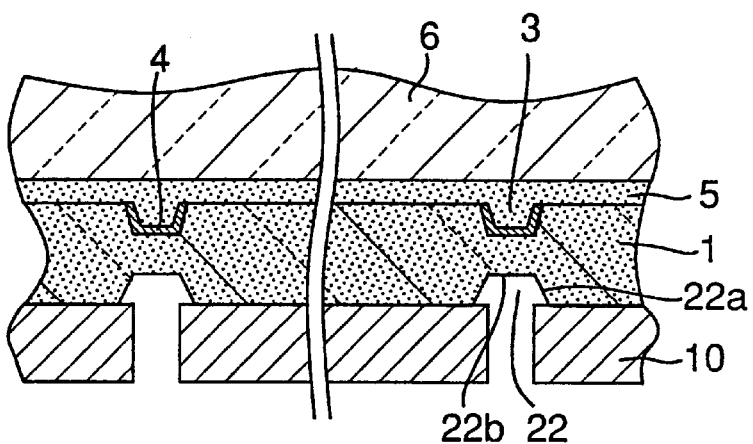
Figure 3C:
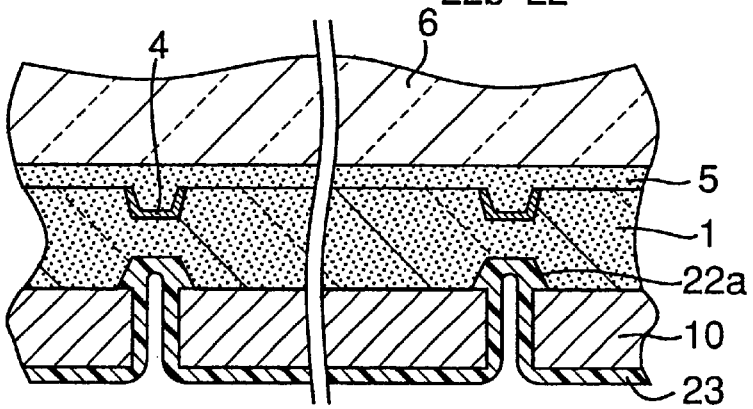

Then a heat dissipating metal layer 10 is formed on portions other than the region which faces the bottoms of the front separation grooves 3 (FIG. 3B). The heat dissipating metal layer 10 is used as a mask in etching. The substrate 1 is etched to such a depth that the first linkage metal layer 4 is not exposed, preferably to a half of the depth that would expose the first linkage metal layer 4, thereby to form first back separation grooves 22 (a first etching).

Figure 3D:
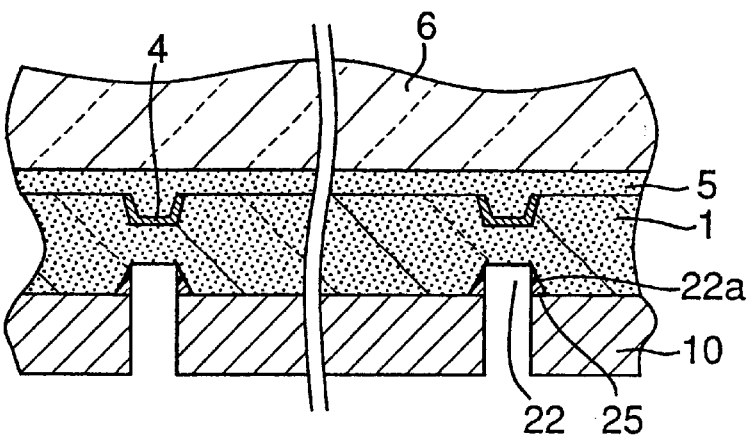

The first back separation grooves 22 are filled with a positive resist 23 and the back surface of the heat dissipating metal layer 10. Then the positive resist 23 is exposed to light. The portion in contact with the side surfaces 22a of the first back separation grooves are behind the heat dissipating metal layer 10 and are not therefore exposed to light. Through development of the positive resist 23, a side-wall like protective film 25 is formed which covers the side-etched portion of the first back separation grooves 22 and has a surface flush with the heat dissipating metal layer 10 (FIG. 3D). The side-wall like protective film 25 may be formed by etch-back instead of the process described above.

Figure 3E:
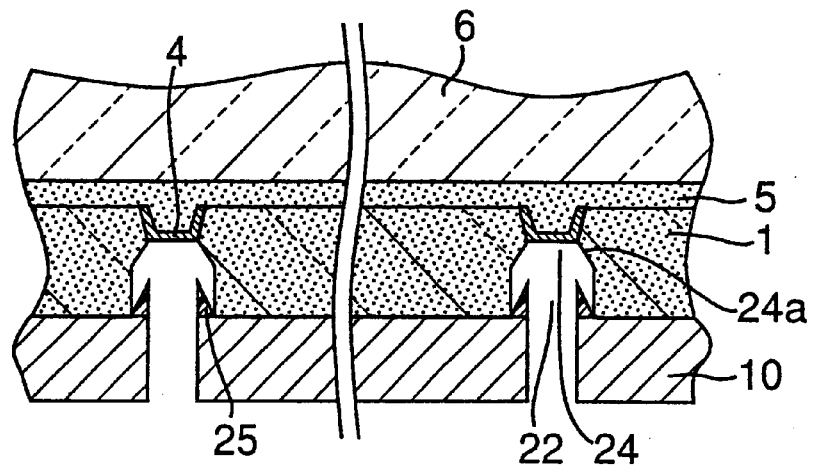

The side-wall like protective film 25 and the heat dissipating metal layer 10 are then used as masks in etching. Etching is done until the linkage metal layer 4 is exposed, thereby to form the second back separation grooves 24 (a second etching) (FIG. 3E).

Figure 3F:
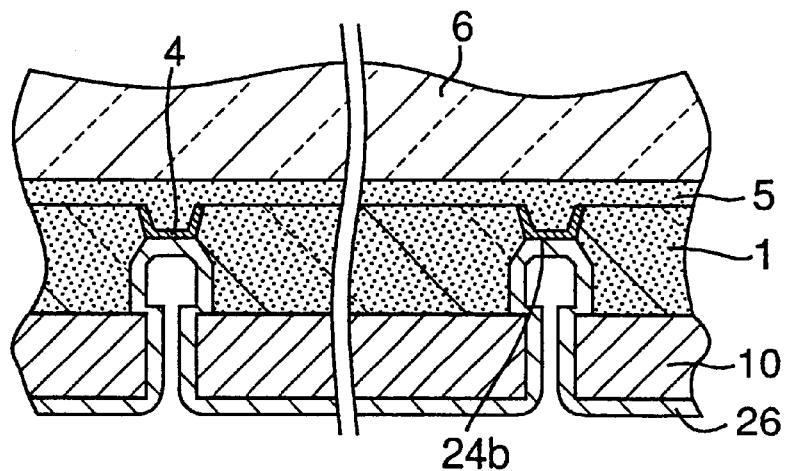
Figure 3G:
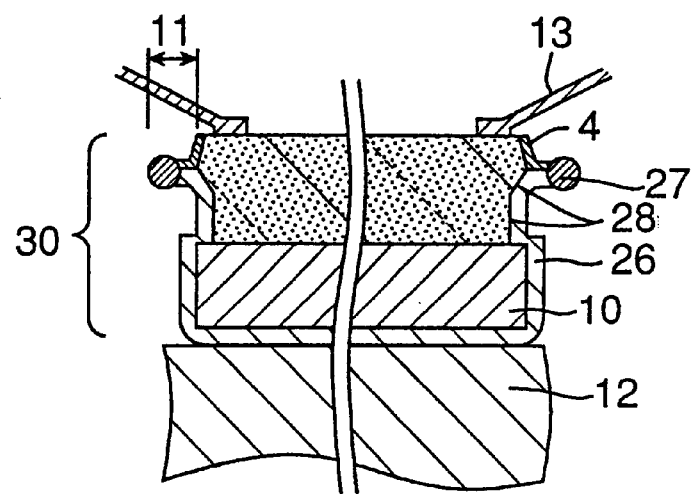

Then the side-wall like protective film 25 is removed. The second linkage metal layer 26 is formed to cover the heat dissipating metal layer 10, the first back separation grooves 22 and the second back separation grooves 24 (FIG. 3F). Then, through processes similar to those of the prior art, the substrate is cut by laser light, into semiconductor chips 30 (FIG. 3G), each of which being bonded onto a package 12 with wires 13 connected thereto, thereby completing the semiconductor device.

The semiconductor device has the flange-shaped protrusions 11 formed as the linkage metal layers 4 and 26 are cut by laser light. The side surfaces of the semiconductor substrate are shaped so as to have an outwardly tapered protrusion defined by a pair of upper side face and lower side face 28 that extend to converge at a point laterally outwardly of the substrate. The lower side face 28 has a stepped configuration which is formed by a first face and a second face, wherein the first face 22a is formed by the first etching (FIG. 3B) and the second face 24a is formed by the second etching (FIG. 3E).

As described previously, the variation in the length of the flange-shaped protrusion 11 depends on the variation in the amount of side etching during etching of the back separation groove. The variation in the amount of side etching is proportional to the depth of etching of the back separation groove. This means that the deeper the back separation grooves 8, the greater the variation in the amount of side etching of the back separation grooves, resulting in greater variation in the length of the protrusions of the metal.

In this embodiment, the variation in the amount of the side etching during formation of the back separation grooves is reduced to about one-half of the prior art. Since the side-wall like protective film 25 prevents side etching from progressing beyond the side surfaces 22a of the first back separation grooves. The variation in the width of the finished bottom 24b of the back separation grooves depends only on the variation of the amount of etching during the formation of the second back separation grooves. As a result, the variation is reduced to about a half that of the prior art.

Consequently, the variation in the length of the flange-shaped protrusion 11 after laser cutting can be reduced. This makes it possible to suppress bending of the flange-shaped protrusion 11 during handling of the semiconductor chips.

In addition, the method in this embodiment has an advantage that the ineffective region of the GaAs substrate 1 where the semiconductor elements cannot be formed is reduced. Usually, the bottoms of the front separation grooves must be wider than the bottoms of the back separation grooves, as described previously. Thus the front separation grooves are designed to have bottom width wider than that of the back separation grooves by the amount of variation of the side etching. Since the variation of the side etching of the back separation grooves is suppressed in this embodiment, the width of the front separation groove can be smaller.

In this embodiment, the heat dissipating metal layer 10 is used as the mask when forming the back separation groove. Use of the heat dissipating metal layer as the mask for forming the separation grooves provides such advantages that the number of patterning steps after thinning the GaAs substrate 1 is reduced. This prevents troubles including breakage of the substrate in the patterning step.

Although the back separation grooves are formed in two steps of etching in this embodiment, the back separation grooves may be formed in three steps of etching. In case such a process is employed, the relation between the first step and the second step in this embodiment is applied to between the first step and the second step and to between the second step and the third step, as well. The second step of etching is done to such a depth that the linkage metal layer 4 is not exposed, and the linkage metal layer 4 is exposed in the third step of etching. This also applies similarly to a case where the back separation grooves are etched in four or more steps.

Embodiment 4

In the fourth embodiment of the present invention, in relation to the case of the first embodiment, width and depth of the front separation grooves are set so that sputter of the linkage metal layer being cut by laser is prevented from depositing on the surface of the GaAs substrate. Also it is intended that the effective area of the GaAs substrate 1 where the semiconductor elements can be formed is increased.

The depth of the front separation grooves is set to be more than a half of the thickness of the thinned semiconductor substrate. The bottom of the front separation grooves is set to be narrower than the bottom of the back separation groove.

The production step according to the fourth embodiment will be described below with reference to FIG. 4A to FIG. 4E. First, similarly to the first embodiment, first front separation grooves 16 are formed on a GaAs substrate 1 and then second front separation grooves 19 and a first linkage metal layer 20 are formed by using a resist pattern 17 as a mask (FIG. 4A). Then the GaAs substrate 1 is bonded onto a supporting substrate 6 with wax 5 (FIG. 4B). The substrate 1 is polished on the back surface thereof to become thinner, followed by etching with the resist pattern 17 used as a mask, thereby to form a back separation grooves 8 (FIG. 4C).

In this embodiment, the first and the second front separation grooves are formed to be deeper than in the case of the first embodiment. Depth of the front separation grooves and thickness of the substrate are set so that total depth of the first front separation grooves 16 and the second front separation grooves 19 is not less than a half of the thickness of the thinned GaAs substrate 1. Preferably the total thickness of the front separation grooves is several micrometers less than the substrate thickness.

Unlike the first embodiment, the bottoms 19b of the second front separation grooved are made narrower than the bottoms 8b of the back separation groove. As mentioned previously, the bottoms 19b of the second front separation grooves are usually made wider than the bottoms 8b of the back separation grooves in order to prevent over-etching of the bottoms of the back separation grooves. However, overetching of the bottoms of the back separation grooves is caused by the variation in the amount of etching. That is, occurrence frequency of over-etching increases in proportion to the etching depth of the back separation grooves.

While the back separation grooves 8 are usually etched to a depth of about 15 to 20 $\mu$m, the depth of etching is much less in this embodiment, preferably several micrometers or less. Consequently, there occurs no problem of over-etching. Thus it is possible to make the bottoms 19b of the front separation grooves narrower than the bottoms 8b of the back separation grooves.

Then similarly to the first embodiment, a second linkage metal layer 21 and a heat dissipating metal layer 10 are formed (FIG. 4D). The substrate is cut off by laser into semiconductor chips 30, each of which being bonded onto a package 12 with wires 13 connected thereto, thereby completing the semiconductor device (FIG. 4E).

In the semiconductor device produced as described above, unlike the first embodiment, the length of the upper side face (sum of 16a and 19a) corresponding to the front separation groove is longer than length of the lower side face 8a corresponding to the back separation groove. And the upper side face 19a protrudes beyond the lower side face 8a.

According to this embodiment, the portion of the first linkage metal layer 20 being cut off by laser can be located further below the surface of the GaAs substrate 1. Thus additional advantage of this embodiment is that sputter of the linkage metal layer 20 being cut off by laser can be prevented from depositing on the GaAs substrate surface.

Further, since the bottom 19b of the second front separation groove can be made narrower, the first front separation grooves 16 can be designed to have relatively smaller width. This makes it possible to increase the effective area of the GaAs substrate 1 where the semiconductor elements can be formed. Hence it is another advantage of this embodiment of the present invention that the number of chips which can be produced from one wafer is increased.

In this embodiment, width and depth of the front separation groove are restricted related to the device in the embodiment 1, effects similar to those described above can be obtained also by making similar restriction in the second embodiment or the third embodiment.

Although the present invention has been fully described by way of examples with reference to the accompanying drawings, it is to be noted here that various changes and modifications will be apparent to those skilled in the art. Therefore, unless such changes and modifications otherwise depart from the spirit and scope of the present invention, they should be constructed as being included therein.

What is claimed is:

1. A method of manufacturing a semiconductor device comprising:

(A) forming front separation grooves in a front surface of a semiconductor substrate between devices on the front surface of a semiconductor substrate by etching;

(B) depositing a linkage metal layer in each of the front separation grooves;

(C) thinning the semiconductor substrate from a back surface of the semiconductor substrate;

(D) forming a heat dissipating metal layer on the back surface of the semiconductor substrates, except opposite the front separation grooves;

(E) forming back separation grooves facing bottom surfaces of the front separation grooves on a back surface of the semiconductor substrate by etching the semiconductor substrate to expose the linkage metal layer; and (F) cutting the linkage metal layer with a laser beam to separate the devices from each other, wherein at least one of (A) and (E) comprises at least two separate etching steps wherein bottom surfaces of grooves formed in a first of the etching steps is further etched in at least one subsequent etching step.

2. The method of manufacturing a semiconductor device according to claim 1, wherein (A) comprises:

(a) forming a first resist pattern having first apertures on the front surface of the semiconductor substrate;

(b) forming first front separation grooves by etching using the first resist pattern as a mask;

(c) forming a second resist pattern covering side surface of the first front separation grooves and a front surface of the semiconductor substrate and having apertures at bottoms of the first front separation grooves; and (d) forming second front separation grooves continuing from the first front separation grooves by etching using the second resist pattern as a mask wherein the linkage metal is deposited only in the second front separation grooves using the second resist pattern as a deposition mask.

3. The method of manufacturing a semiconductor device according to claim 1, wherein (E) comprises:

(a) forming first back separation grooves on the back surface of the semiconductor substrate by etching to such a depth that the linkage metal layer is not exposed, using the heat dissipating metal layer as an etching mask;

(b) forming a protective film covering side surface of the first back separation grooves; and (c) forming second back separation grooves by etching to such a depth that the linkage metal layer is exposed, using the protective film and the heat dissipating metal layer as etching masks.

4. The method of manufacturing a semiconductor device according to claim 1, wherein grooves have a depth not less than onete, half of the thickness of the semiconductor substrate, and the bottom surface of the front separation grooves are narrower than the bottom surfaces of the back separation grooves.

* * * * *